US006690750B1

(12) United States Patent
Hocevar et al.

(10) Patent No.: US 6,690,750 B1
(45) Date of Patent: Feb. 10, 2004

(54) FLEXIBLE VITERBI DECODER FOR WIRELESS APPLICATIONS

(75) Inventors: Dale E. Hocevar, Plano, TX (US); Alan Gatherer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/471,430

(22) Filed: Dec. 23, 1999

(51) Int. Cl.[7] .......................... H03D 1/00; H03M 13/03
(52) U.S. Cl. ...................... 375/341; 375/340; 714/786; 714/795
(58) Field of Search .................................. 375/341, 340; 341/51; 708/523; 714/786, 792, 795

(56) References Cited

U.S. PATENT DOCUMENTS

| | | | |
|---|---|---|---|
| 5,068,859 A | | 11/1991 | Collins et al. |
| 5,327,440 A | | 7/1994 | Fredrickson et al. |
| 5,469,452 A | | 11/1995 | Zehavi |
| 5,513,220 A | * | 4/1996 | Blaker et al. ............. 375/340 |
| 5,633,897 A | | 5/1997 | Fettweis et al. |
| 5,781,569 A | | 7/1998 | Fossorier et al. |
| 5,912,908 A | | 6/1999 | Cesari et al. |
| 5,970,104 A | * | 10/1999 | Zhong et al. ............. 375/341 |
| 5,978,414 A | | 11/1999 | Nara |
| 5,987,490 A | | 11/1999 | Alidina et al. |
| 6,317,472 B1 | * | 11/2001 | Choi et al. ............... 375/341 |
| 6,408,418 B1 | * | 6/2002 | Bl ............................ 714/786 |
| 2002/0010895 A1 | * | 1/2002 | Mujtaba .................... 714/795 |

OTHER PUBLICATIONS

Feygin et al. "A VLSI Implementation of a Cascade Viterbi Decoder with Traceback", Circuits and Systems, 1993, ISCAS '93, 1993 IEEE International Symposium on, May 3–6, 1993.*

Black et al. ("A Unified Approach to the Viterbi Algorithm State Metric Update for Shift Register Processes", Acoustics, Speech, and Signal Processing, 1992, ICASSP–92, 1992 IEEE International Conference on, vol. 5, Mar. 23–26, 1992.*

"Viterbi Decoding Techniques in the TMS320C54x Family", Henry Hendrix, Member, Group Technical Staff, Texas Instruments Incorporated, SPRA071, Jun., 1996, 12 pages.

"VLSI Structures for Viterbi Receivers: Part 1—General Theory and Applications", IEEE Journal on Selected Areas in Communications, vol. SAC–4, No. 1, Jan., 1986, pp. 142–154.

"High–Performance VLSI Architecture for the Viterbi Algorithm", IEEE Transactions on Communications, vol. 45, No. 2, Feb., 1997, pp. 168–176.

"Locally Connected VLSI Architectures for the Viterbi Algorithm", IEEE Journal on Selected Areas in Communications, vol. 6, No. 3, Apr., 1988, pp. 527–537.

(List continued on next page.)

*Primary Examiner*—Stephen Chin
*Assistant Examiner*—Edith Chang
(74) *Attorney, Agent, or Firm*—Frederick J. Telecky, Jr.; W. James Brady, III

(57) ABSTRACT

A Viterbi decoder system is provided in accordance with the present invention. The decoder system includes a State Metric Update unit including a state metric memory and a cascaded Add/Compare/Select (ACS) unit. The cascaded ACS unit comprises a plurality of serially coupled ACS stages for performing a plurality of ACS operations in conjunction with the state metric memory. An ACS stage is operable to identify a plurality of path decisions and communicate the identified path decisions to a next ACS stage coupled thereto. A Traceback unit is provided for storing a set of accumulated path decisions in a traceback memory associated therewith, and performing a traceback on the set of accumulated path decisions. The path decisions associated with the ACS stage and the next ACS stage are accumulated as a set during the ACS operations before being written to the traceback memory, thereby minimizing accesses to the traceback memory.

22 Claims, 6 Drawing Sheets

OTHER PUBLICATIONS

"Area–Efficient Architectures for the Viterbi Algorithm—Part I: Theory", IEEE Transactions on Communications, vol. 41, No. 4, Apr., 1993, pp. 636–644.

"A Multiprocessor Architecture for Viterbi Decoders with Linear Speedup", IEEE Transactions on Signal Processing, vol. 41, No. 9, Sep., 1993, pp. 2907–2917.

"An Area–Efficient Topology for VLSI Implementation of Viterbi Decoders and Other Shuffle–Exchange Type Structures", IEEE Journal of Solid–State Circuits, vol. 26, No. 2, Feb., 1991, pp. 90–97.

"An area–efficient path memory structure for VLSI implementation of high speed Viterbi decoders", Integration, the VLSI Journal 12 (1991) pp. 79–91.

"Algebraic Survivor Memory Management Design for Viterbi Detectors", IEEE Transactions on Communications, vol. 43, No. 9, Sep., 1995.

"Generalized Trace Back Techniques for Survivor Memory Management in the Viterbi Algorithm", IEEE, 1990, pp. 1318–1322.

* cited by examiner

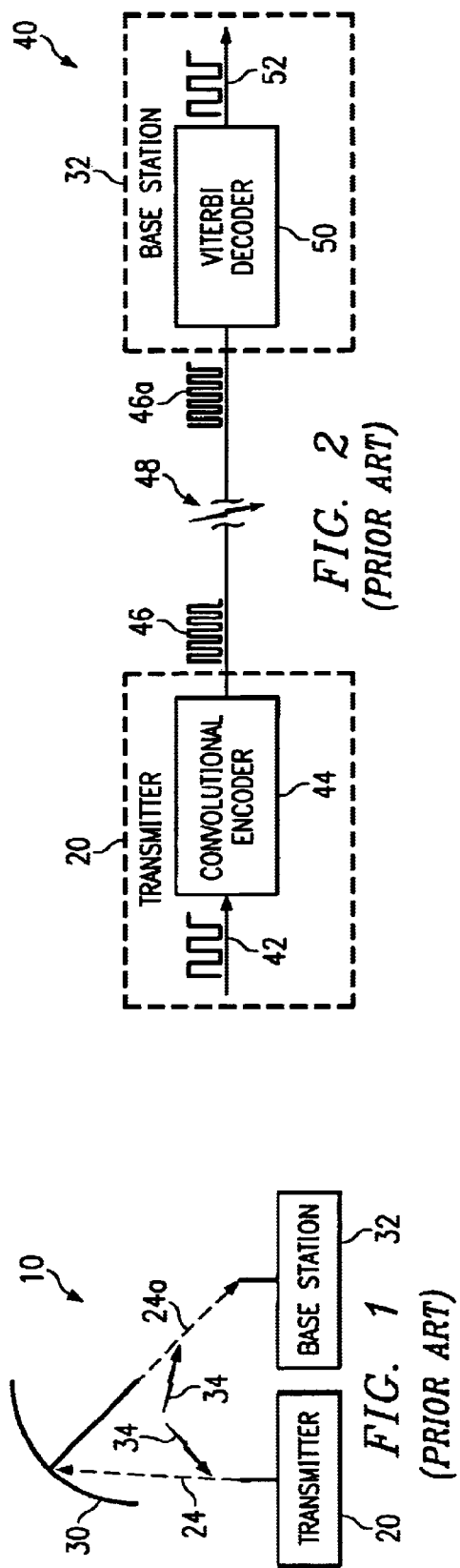
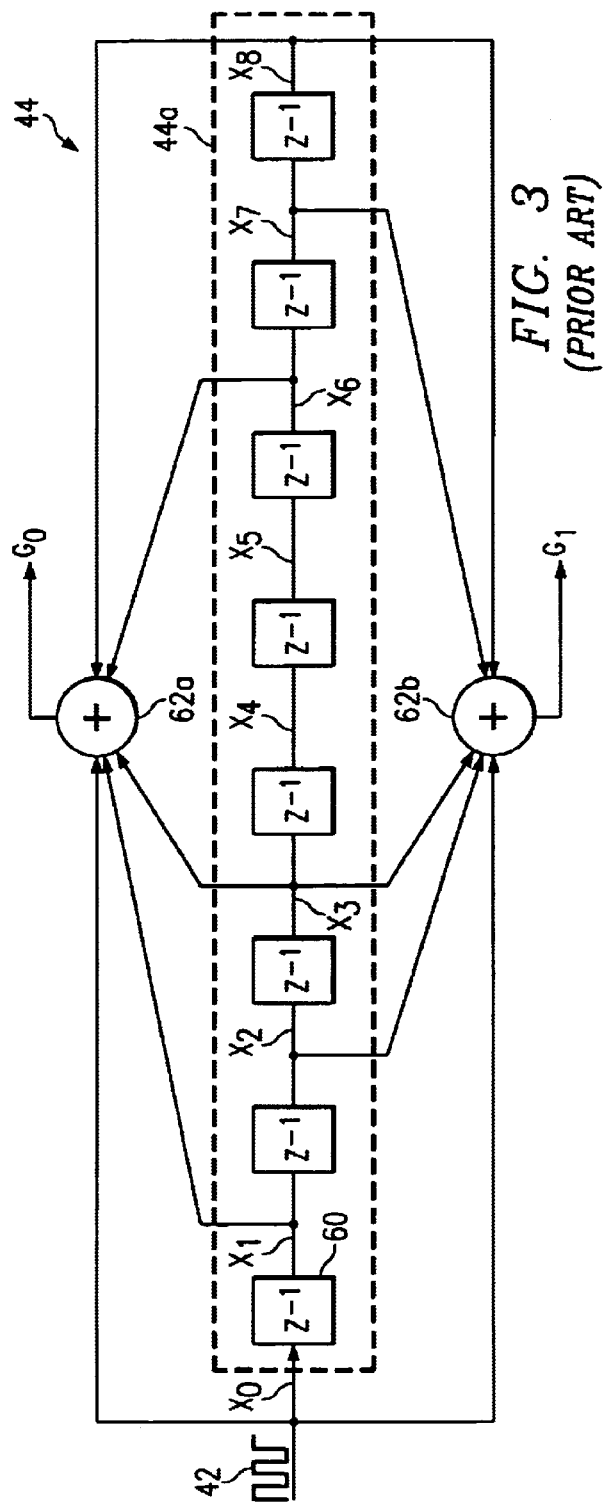
FIG. 1 (PRIOR ART)
FIG. 2 (PRIOR ART)
FIG. 3 (PRIOR ART)

FLEXIBLE VITERBI DECODER FOR WIRELESS APPLICATIONS

FIELD OF THE INVENTION

The present invention relates generally to Viterbi decoding systems, and in particular to a system and method for providing flexible, high-speed, and low-power decoding (based on the Viterbi algorithm) of convolutional codes for wireless and other type communication applications.

BACKGROUND OF THE INVENTION

Modern society has witnessed a dramatic increase in wireless communications. Wireless technology (e.g., satellite, microwave) has provided a system whereby cellular and other communications have become an ever increasing necessity. In order to satisfy the demand for increased and reliable communications capability, more flexible, powerful, and efficient systems are needed. In particular, forward error correction systems must be improved to satisfy society's need for increased wireless communications.

Forward error correction systems are a necessary component in many of today's communications systems. These systems generally add robustness to communications systems by substantially correcting errors that may occur during transmission and reception of wireless data. This is particularly true for systems which are limited in power and/or bandwidth. Often, convolutional coding is a key part in such forward error correction systems. In general, convolutional coding systems introduce redundancy data into a wireless data transmission so that random errors occurring in the transmission have a high probability of being corrected. Consequently, decoding systems (e.g., a Viterbi decoder) must be in place to decode the convolutionally coded data upon reception of the transmitted data, and thereby reconstruct the actual data transmission.

Referring to prior art FIG. 1, a wireless communications system 10 illustrates a particular challenge presented to a conventional wireless system. A transmitter 20 directs a communications signal 24 to a satellite system 30. The satellite system 30, upon receiving the communications signal 24, then directs a communications signal 24a to a ground base station 32 wherein the signal is processed for the intended destination. Anytime during transmission of the communications signal 24 and 24a, noise 34 may corrupt a portion of the transmission (cause an error), thereby causing improper signal reception at the base station 32. If error correction systems were not provided, the signal would likely have to be re-transmitted in order to be properly received at the base station 32. Thus, inefficiencies and increased costs are likely results.

FIG. 2 illustrates a prior art error correction system 40 employing convolutional encoding and Viterbi decoding for increasing the likelihood that transmission signals may be properly communicated despite the presence of noise. Input data 42 (e.g., audio, video, computer data) is input to a convolutional encoder 44. Encoded data is provided as a sequence of data bits 46 (also referred to as encoded symbols), which are composed of actual and redundantly added data, and transmitted over a communications link 48. The communications link 48 may introduce noise into the data transmission and therefore, the transmitted data bits 46 may be corrupted by the time they reach their destination. Each received (and possibly corrupted) data bit 46a may be processed by a Viterbi decoder 50 to provide decoded output data 52. The Viterbi decoder 50, (based upon the Viterbi algorithm which was first proposed by Andrew Viterbi in 1967), provides a decoding system wherein the input data 42 that was originally transmitted may be determined to a high probability even though noise may have affected some of the transmitted (convoluted) data 46. In general, the input data 42 may be determined by computing a most likely sequence for the input data 42 which is derived from the convolutionally encoded data 46a.

Convolutional encoding is performed by convolving (redundantly adding) input data bits 42 via an encoder with one or more previous input bits 42. An example of a conventional rate ½, constraint length 9, convolutional encoder 44 is shown in prior art FIG. 3. Input bits 42 are input to a series of delay elements 60, such as a shift register 44a, that provides outputs $X^0$ through $X^8$ at various points. The outputs $X^0$ through $X^8$ may be combined by an XOR function 62a and 62b to generate an encoded symbol set $G_0$ and $G_1$. The outputs, $X^0$ through $X^8$, which are connected (tapped) to the XOR function 62a and 62b, will determine an output code sequence of $G_0$ and $G_1$ for a given input data sequence 42. The input to output relationship may be described by a code polynomial for the encoder outputs $G_0$ and $G_1$. For example, for the encoder 44 shown in FIG. 3, the code polynomial is given as:

$$G_0 = X^0 + X^1 + X^3 + X^6 + X^8 = 1 + X^1 + X^3 + X^6 + X^8; \text{ and}$$

$$G_1 = X^0 + X^2 + X^3 + X^7 + X^8 = 1 + X^2 + X^3 + X^7 + X^8$$

Note: Texas Instruments Applications Report SPRA071, Viterbi Decoding Techniques in the TMS 320C54x Family, 1996, provides further details on convolutional encoders and code polynomials and is hereby incorporated by reference in its entirety.

As shown, the encoder 44 of FIG. 3, generates the encoded symbol set, $G_0$ and $G_1$, for every input bit 42. Thus, the encoder has a rate of ½ (1 input/2 output). The constraint length (K) represents the total span of combinations employed by the encoder which is a function of the number of delay elements 60. A constraint length K=9 implies there are $2^{(9-1)}=256$ encoder states (the ninth bit is the input bit). These states are represented as state S0 (binary 00000000) to state S255 (binary 11111111).

Convolutionally encoded data may be decoded according to the Viterbi algorithm. The basis of the Viterbi algorithm is to decode convolutionally encoded data by employing knowledge (e.g., mimic the encoder) of the possible encoder 44 output state transitions from one given state to the next based on the dependance of a given data state on past input data 42. The allowable state transitions are typically represented by a trellis diagram (similar to a conventional state diagram) which provides possible state paths for a received data sequence based upon the encoding process of the input data 42. The trellis structure is determined by the overall structure and code polynomial configuration of the convolutional encoder 44 described above. The Viterbi algorithm provides a method for minimizing the number of state paths through the trellis by limiting the paths to those with the highest probability of matching the transmitted encoder 44 output sequence with the received data sequence at the decoder.

FIG. 4 is an illustration of a portion of a trellis 66 and depicts a basic Viterbi algorithm butterfly computation. Four possible encoder transitions 70a through 70d from present state nodes 68a and 68b, to next state nodes 68c and 68d are illustrated. As shown, two transition paths (branches) exist from each present state node 68a and 68b to each next state node 68c and 68d. The Viterbi algorithm provides a process by which the most likely of two possible transition paths may be determined and subsequently selected as a portion of a "survivor" path. For example, branches 70a and 70b provide two possible transition paths to the next state node 68c. Likewise, branches 70c and 70d provide two possible transition paths to the next state node 68d. The transition paths 70a through 70d provide the possible directions to the next most likely states that may be generated by the convolutional encoder 44 as directed by the input bits 42. Once a sequence of survivor paths have been determined (through a plurality of butterfly stages), the most probable data input sequence 42 to the convolutional encoder 44 can be reconstructed, thus decoding the convolutionally encoded data.

The decoder operation generally includes the steps of a branch metric computation, an Add/Compare/Select (ACS) operation, and a traceback operation. The branch metric computation provides a measurement of the likelihood that a given transition path from a present state to a next state is correct. In the branch metric computation, the received data values, typically an 8 or 16 bit digital value representing the magnitude of voltage or current of an input signal, are processed to determine a Euclidean or equivalent distance (see reference noted above for further details) between the received data values and all possible actual data values, uncorrupted by noise, which may result from a state transition from a present state to a next state.

Thus, decoding data signals from a convolutional decoder of rate 1/R with a constraint length of K requires determining a total of $2^R$ branch metric values for each encoded symbol input to the decoder. As described herein, the set of $2^R$ branch metric values is defined as the complete branch metric set for a particular received input symbol.

In the next decoder step, previously computed branch metric values for all possible state transitions are processed to determine an "accumulated distance" for each of the paths to the next state. The path with the minimum or maximum distance, depending on the implementation, (i.e., maximum probability) is then selected as the survivor path. This is known as the Add/Compare/Select, or ACS operation. The ACS operation can be broken into two basic operations. An Add operation, or path metric computation, and the Compare/Select operation. The path metric Add operation is the accumulation of present state values (initialized by a user at the start of Viterbi processing and carried forward from state to state) with the branch metric values for a received data input sequence. The Compare-Select operation computes and compares two values from the Add operation to determine the minimum value (or maximum value, depending on the implementation) and stores one or more "traceback bits" to indicate the selected survivor path.

The final decoding step is the traceback operation. This step traces the maximum likelihood path through the trellis of state transitions, as determined by the first two steps, and reconstructs the most likely path through the trellis to extract the original data input to the encoder 44.

Conventionally, digital signal processors (DSPs) have been employed to handle various Viterbi decoding applications. Many DSPs have special instructions specifically designed for the Viterbi decoding algorithm. For example, many of today's cellular phone applications involve DSP solutions. However, when a code such as the code described above (K=9) is employed in conjunction with high data rates (384 kbits/sec–2 Mbits/sec), high computation rates are generally required. This may require $49 \times 10^6$ to $256 \times 10^6$ Viterbi ACS operations per second. These computing operations are multiplied even more when multiple voice/data channels are processed by a DSP in a cellular base station, for example. Thus, Viterbi decoding may consume a large portion of the DSPs computational bandwidth. Consequently, higher performance systems are necessary to meet increased computational demands.

Another challenge faced by conventional decoding systems is the need to decode various forms of convolutional codes. Many decoding systems are hard-wired and/or hard-coded to deal with a particular type of convolutional code. For example, the constraint length K, described above, may vary (e.g., K=9,8,7,6,5, etc.) from one encoding system to the next. Also, the code polynomials mentioned above may vary from system to system, even though the constraint length may remain unchanged. A hard-wired and/or hard-coded decoding system may need to be re-designed in order to meet these different encoding requirements. Various other parameters also may need to be varied in the encoding/decoding process as well. Therefore, it would be desirable for a decoding system to provide a high degree of flexibility in processing various forms of encoded data.

Still another challenge faced by conventional decoding systems are increased power requirements. As data is decoded at higher rates, computational demands of the decoding system often times increase the power requirements of the decoders (e.g., DSPs, processing systems). Many conventional systems require extensive register and memory accesses during the decoding process. This generally increases power consumed in decoders and generally lowers decoder performance (e.g., speed, reliability).

In view of the above problems associated with conventional decoding systems, it would therefore be desirable to have a Viterbi decoding system and/or method which provides a high degree of flexibility with increased decoding performance and with lower power requirements.

SUMMARY OF THE INVENTION

The present invention is directed toward a VLSI architecture for a Viterbi decoder for wireless or other type applications which may operate within a programmable DSP system, and which provides flexibility, low-power, and high data throughput rates. The architecture is intended to provide a cost effective solution for multiple application areas, including cellular basestations and mobile handsets.

The decoder preferably operates on a plurality of common linear (single shift register) convolutional codes of rate 1/n and constraint length, K=9 (256 states), or less, and is capable of a substantially high throughput rates of 2.5 Mbps in the case of K=9. In particular, high data throughput rates are achieved by a cascaded ACS system which operates over several trellis stages simultaneously. Additionally, the cascaded ACS performs a partial pretraceback operation, over multiple trellis stages, during the ACS operation. This increases system throughput by reducing the complexity of a final traceback operation to retrieve decoded output bits and substantially decreasing the number of memory accesses associated therewith.

The high data throughput rate enables the decoder to handle substantially hundreds of voice channels for next generation cellular basestations. This may greatly reduce the number of DSP processors a system requires and likely lowers system costs of a purely DSP based system. These types of data rates and codes are employed extensively in wireless applications of many varieties from satellite communications to cellular phones.

Since there are variations between particular encoding applications, and within some decoding applications with regard to the exact structure of the Viterbi decoding problem, flexibility in the decoding architecture is provided. In particular, the cascaded ACS system described above may be configured to operate on variable constraint length codes by operating over multiple stages of the trellis for K=9. This is accomplished by operating on a sub-trellis architecture in conjunction with a state metric memory. For the cases of K<9, particular ACS stages are bypassed selectively.

The present invention incorporates a high degree of flexibility to enable the decoder to be employed in many variable situations. The decoder flexibility includes variable constraint lengths, user supplied polynomial code coefficients, code rates, and traceback settings such as convergence distance and frame structure.

A DSP interface is provided which is memory mapped to enable high data rate transfers between the decoder of the present invention and a DSP. This greatly reduces the processing burden of the DSP and provides for a more powerful system overall. Significant buffering is also provided within the decoder. The present invention also supports intelligent data transfer and synchronization mechanisms, including various trigger signals such as: execution done, input buffer low, and send/receive block transfer completed.

Additionally, the present invention has been designed to operate at high data rates and to be highly energy efficient, (i.e., low power). Low power operations are accomplished by minimizing register operations and memory accesses, and by paralleling and streamlining particular aspects of the decoding process. For example, the ACS operation described above performs pretraceback operations during the ACS operation. Additionally, memory accesses are reduced by operating over multiple stages of the trellis simultaneously.

To the accomplishment of the foregoing and related ends, the invention comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a block diagram of a prior art wireless communications system;

FIG. 2 is a block diagram of a prior art convolutional encoder and Viterbi decoder;

FIG. 3 is a schematic block diagram of a prior art convolutional encoder;

DETAILED DESCRIPTION OF THE INVENTION

Figure 6:
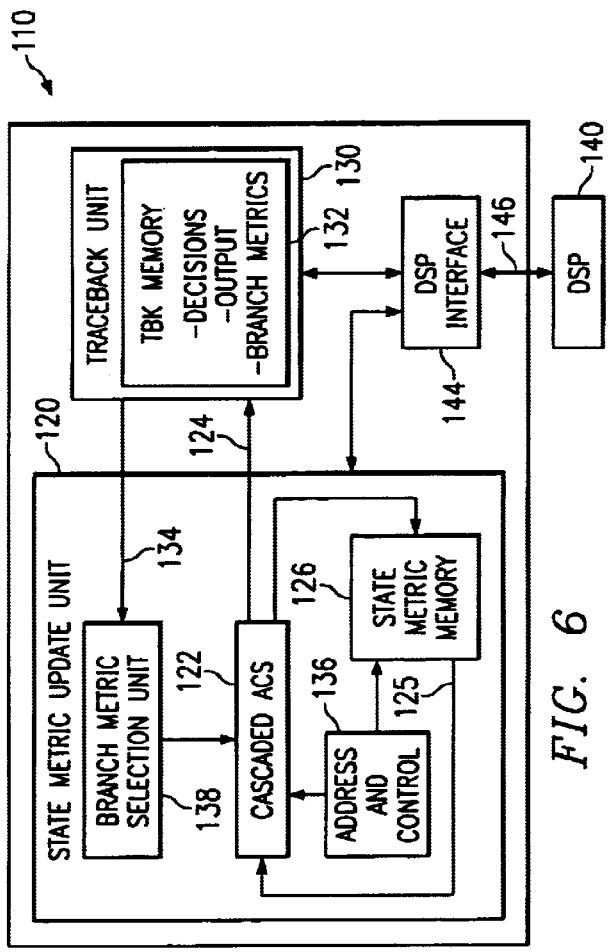
FIGS. 6 is a schematic block diagram of a Viterbi decoder in accordance with the present invention.

The present invention will now be described with reference to the drawings, wherein like reference numerals are used to refer to like elements throughout.

Figure 7:
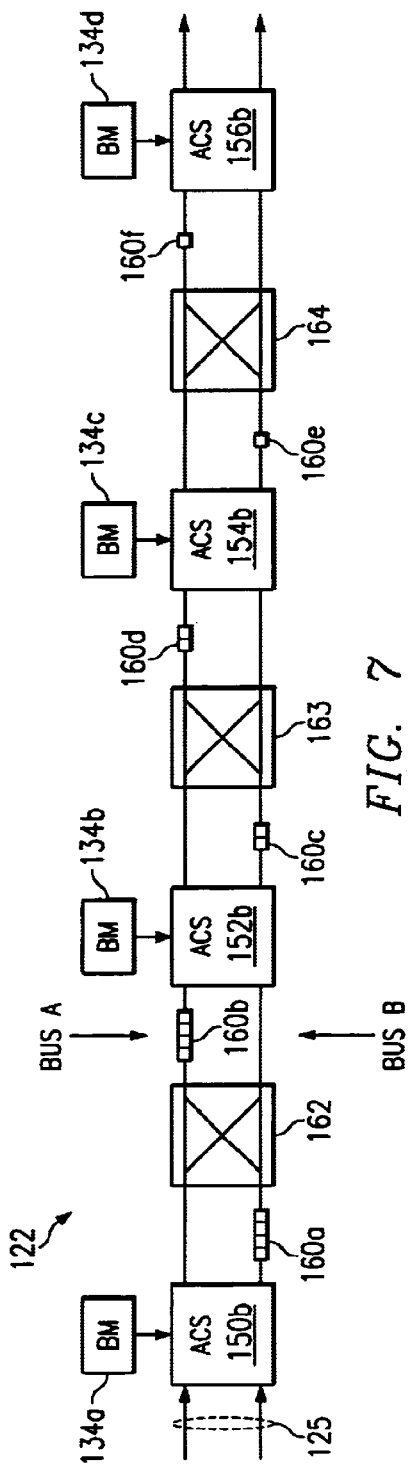
FIG. 7 is a schematic block diagram of a cascaded ACS unit for a Viterbi decoder in accordance with the present invention.
Figure 8:
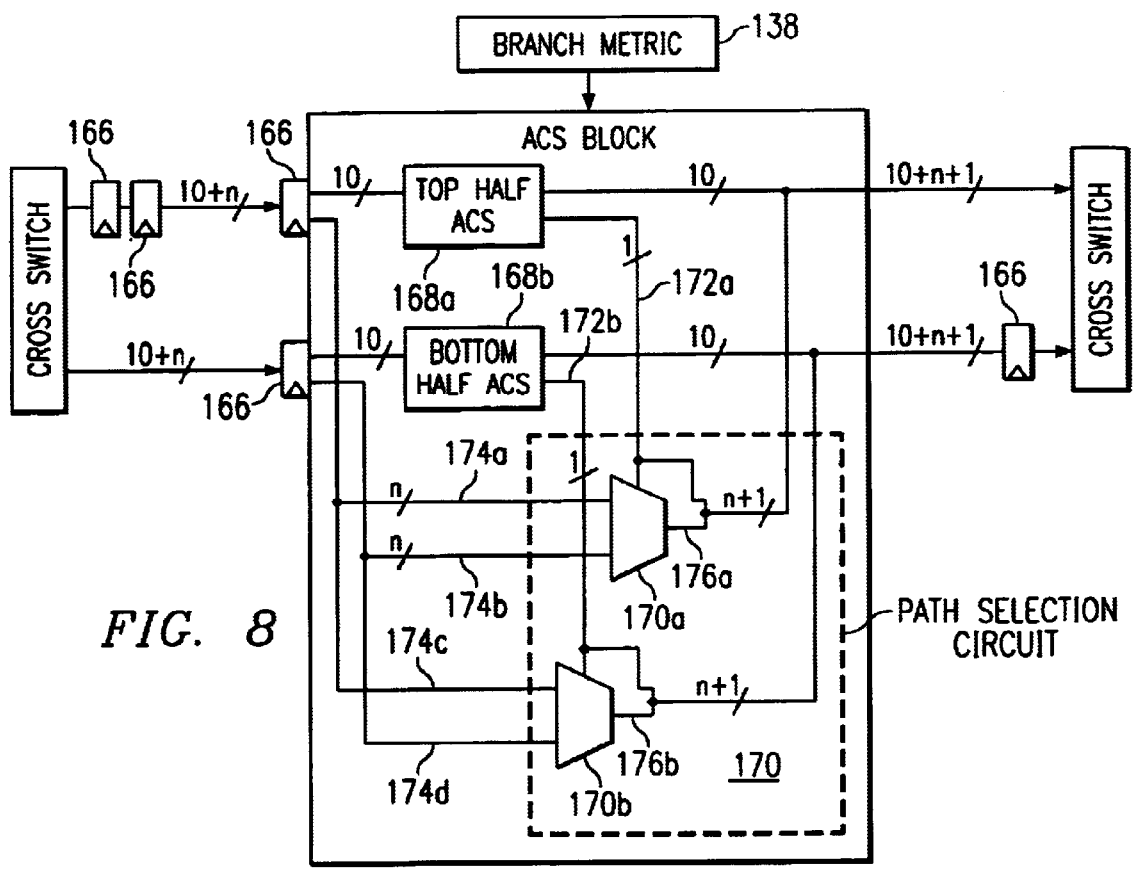
FIG. 8 is a more detailed schematic block diagram of an ACS unit for a Viterbi decoder in accordance with the present invention.

In accordance with the present invention, a Viterbi decoder 110 (FIG. 6) decodes a plurality of trellis stages (FIG. 5) simultaneously via a cascaded ACS 122 (FIG. 7). This substantially reduces memory access cycles, and thereby lowers power requirements and increases system throughput. During the cascaded ACS operation, a partial traceback of the trellis occurs simultaneously during the ACS operation via a unique register exchange architecture (FIG. 8). This also, lowers power requirements and increases system throughput. Additionally, variable constraint length codes, may be solved via bypass systems implemented within the cascaded ACS 122, and a plurality of user supplied code polynomials may be employed (FIG. 9) to decode various encoding structures. This provides a substantial degree of flexibility in the decoder 110.

Figure 5:
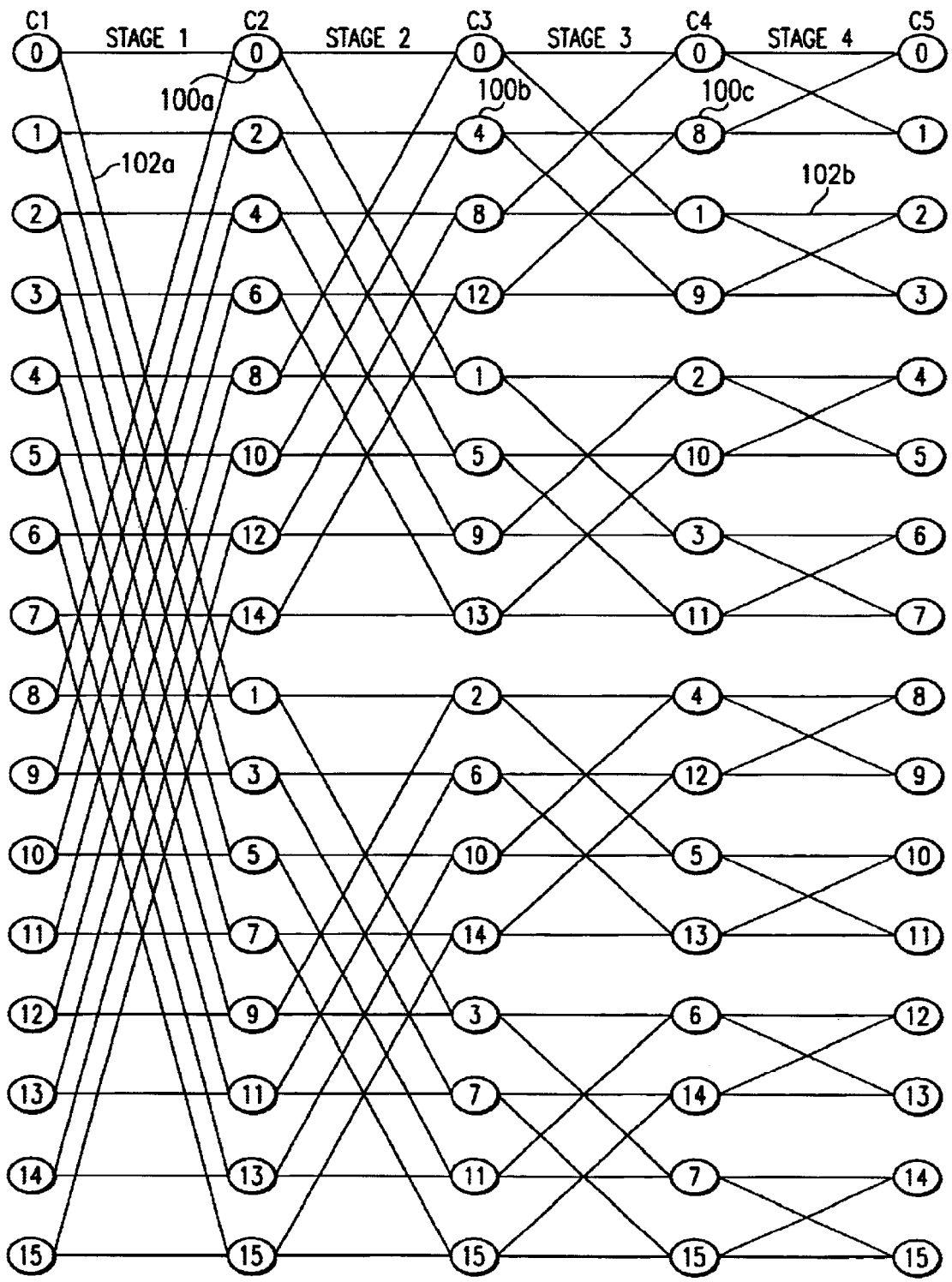
FIG. 5 is a 4 stage, 16 state trellis diagram for Viterbi decoding in accordance with the present invention.

Referring initially to FIG. 5, a trellis diagram is shown in accordance with an exemplary embodiment of the present invention. The trellis corresponds to a convolutional encoder from a single shift register code having sixteen states (K=5). The sixteen states are represented by state indices (indexes) 0 through 15 (e.g., 100a, 100b, 100c) which are shown in columns C1 through C5 and which correspond to particular points in time (e.g., transitions from one encoder state to the next). The transitions between columns may be referred to as stages (e.g., stage 1, stage 2 etc.). Each stage provides an input to output bit mapping from left to right from a previous state (left) to a present or next state (right), and a set of branches (e.g., 102a, 102b) represent possible bit transitions between stages. The input to output (stage to stage) bit mapping is provided by a set of code polynomials which describe the encoder configuration and is supplied by a user.

The state indices are generated as pointers to memory locations for holding an accumulated state metric (described in more detail below) from previous stages. It is noted that each state index in each column may only transition (provide outputs) to two other defined state indices in the next stage to the right in the diagram. Likewise, each state index in a column to the right of a column may only receive two inputs from defined state indices on the left. For example, state 8 in column C1 may only transition to state 0 or state 1 in each of the columns C2, C3, C4, etc. In a similar manner, state 12 in any column, may only receive inputs from state 6 or state 14 in columns C1, C2, C3 etc.

As will be described in more detail below, a likely path through the trellis, which ultimately determines the original input data to the encoder, is determined in the present invention by performing an ACS (Add/Compare/Select) operation for every set of branches entering each state. A set of branch metrics (described in more detail below) are added (the Add portion of ACS) to the accumulated state metrics from the previous stage (initially, the accumulated state metrics in column C1 may be reset to a desired predetermined value, e.g., a value of 0 or a very large number). Then, a branch is chosen (the Compare and Select portion of ACS) from each ACS operation based on which branch will yield the lowest or preferably the highest accumulated state metric for the next stage. After a number of stages have been solved via the ACS operation, the chosen branches will begin to converge on an overall path. By tracing back (described in more detail below) a path through each stage from the selected branches, the decoded data may be determined.

A top-level schematic block diagram of a Viterbi decoding system 110 in accordance with the present invention is shown in FIG. 6 and generally consists of two primary units: A State Metric Update Unit 120, and a Traceback Unit 130. The State Metric Update Unit 120 includes a cascaded ACS 122, a state metric memory 126, and a branch metric selection unit 138 for receiving branch metrics 134 from the Traceback unit 130 and synchronizing the branch metrics 134 with the ACS 122.

The cascaded ACS 122, in conjunction with the state metric memory 126, determines a set of accumulated state metrics (SM) 125, which also may be referred to as path metrics, for each stage in the trellis as the decoding process moves forward in time. The cascaded ACS 122 performs additions, subtractions, and comparisons, with a set of incoming branch metrics 134 and selects new state metrics from which path decision values 124 are determined. This is accomplished by evaluating a metric at each state to determine which one of two incoming branches provides the smallest or preferably largest next state metric 125 depending on the particular algorithm implementation desired. The evaluation is performed by the ACS 122, by adding branch metrics 134 to the state metric memory 126 which is addressed by the state indices from which the branch originates. As will be described in more detail below, branch metrics 134 (preferably determined by a peripheral DSP 140) are sets of numbers, one set per trellis stage, which are derived from the convoluted input data to the decoder and are typically distance measures between the receiver's (input) soft decisions and known modulation points. Other forms of branch metric data, however, may be employed and such data forms are contemplated as falling within the scope of the present invention.

Preferably, an SRAM memory 126 stores the set of state metrics 125 which are continually being read out, updated and written back thereto. The path decision values 124 are provided to the Traceback Unit 130 and a memory 132 associated therewith by the cascaded ACS 122, wherein the path decision values 124 are employed in traceback determinations of the decoded data as will be described in more detail below.

An address and control block 136 directs data through the trellis and provides memory addressing for the state metric memory 126. The address and control block 136, which is described in more detail below, is responsible for state index generation which is based upon a user supplied constraint length. The address and control block 136 is also responsible for synchronizing the branch metrics 134, which are received in the branch metric selection unit 138, with the ACS 122.

The Traceback Unit 130 is the other primary unit in accordance with the present invention and serves multiple functions. The Traceback unit 130 stores path decisions 124 received from the cascaded ACS 122, and performs a traceback therefrom. The process of traceback creates the output (decoded) bits, and provides storage for the decoded output and the incoming branch metrics 134. The Traceback Unit 130 preferably contains one or more memories 132 for storing such data.

A unique feature of the decoding system 110 is the partitioning of the overall decoding process between the decoding system 110 and preferably a DSP 140 to which the system 110 provides support. All of the branch metric computations preferably are performed external to the system 110, preferably in the host DSP 140. Likewise, depuncturing manipulations may also be performed by the DSP 140 (e.g., insertion of null or other compensating values into the input stream). This provides for more user control over these functions (e.g., branch metric computation, depuncturing, etc.).

The decoder system 110 is flexible in operation. Specifically, it may operate on constraint lengths of 5 through 9, and process up to 256 states over four trellis stages simultaneously. The system 110 processes the rate ½ and ⅓ cases with arbitrary sets of user supplied code coefficients. Also, the bit rate may be variable (e.g., the decoder may operate by detecting a received data frame of a fixed size, regardless of the bit rate). The system 110 may process framed input data where the tail (input bits inserted to force a particular state) of the data forces a return to state zero or the system may run in a continuous decode mode with no forced states. Certain options for effectively presetting state metrics at the start of a frame also are available. For example, a user may desire to set state zero's initial metric to a largest value and all other states to a smallest value to force all traceback paths to return to state zero at the start of the frame. The convergence distance that the traceback process utilizes before generating output bits also is an adjustable parameter and is supplied by a user.

A DSP interface circuit 144 provides a memory mapping interface to the decoder system 110. The DSP interface 144 operates utilizing block data transfers of incoming branch metrics and outgoing decoded bits (shown as bus 146). These transfers may be performed employing DMA (or other ) peripheral DSP support. Thus, the bus is utilized efficiently and minimal interaction is required from the DSP 140.

Now referring to FIG. 7, a more detailed block diagram of the cascaded ACS unit 122 is shown in accordance with the present invention. The ACS unit 122 processes a set of state metrics 125 (from the state metric memory 126 of FIG. 6) along with a corresponding set of branch metrics 134a through 134d (collectively referred to as 134, and received from the traceback memory 132). This is achieved by processing the set of state metrics 125 which are carried forward in time, stage to stage, as an accumulated state metric, through the trellis depicted in FIG. 5. At each stage of the trellis, which correspond to ACS stages 150b through 156b, accumulated state metrics are updated utilizing the branch metric data 134 of the current stage. State metric updates are accomplished by determining the optimal branch (identified path decision) from the two possible trellis branches from the previous trellis states. It is noted that one ACS operation is provided for each node in a column per trellis stage. For example, in FIG. 5, 16 ACS operations are provided for column C2, C3, C4 and C5, therefore, each column includes 16 ACS operations per ACS stage 150b, 152b, 154b and 156b of FIG. 7.

The optimal branch refers to the branch (identified path) which yields the smallest or preferably largest next state metric as defined by adding the branch metric 134 to the accumulated state metric 125 of the trellis state from which the trellis branch originates. Each trellis branch corresponds to a set of possible output bits, and the branch metric corresponds to a distance measure from the output bits to the received input data. The output bits are preferably mapped to a constellation point which is transmitted, and the branch metric is the Euclidian distance between the received data and the constellation point. Branch metric computations are well known in the art and further discussion related thereto is omitted for the sake of brevity.

As the ACS process is performed, the chosen branches (e.g., path decisions) for each state at each stage of the trellis are recorded. Thus, the optimal paths (e.g., identified paths) to each state are known. The decoder system 110 output is then determined by traversing through the trellis in a reverse direction following the selected branches from above. After a certain distance, (known as the convergence distance), all of the identified paths from other trellis states will most likely have converged to a single path. At this point, valid decoded output bits may be derived from the traceback process which is described in more detail below.

As shown in FIG. 7, the ACS unit 122 of the present invention forms a cascade and consists of four ACS blocks 150b through 156b with groupings of delay registers 160a through 160f and cross switches 162 through 164 between the blocks. Each ACS block performs a plurality of radix-2 or butterfly Add/Compare/Select operations over one stage of the trellis. The ACS cascade 122 performs a radix-16 ACS operation over four stages of the trellis. Radix-N refers to the size of the sub-trellis that is operated upon. N refers to the number of states and must be a power of two. As will be described in more detail below, the trellis shown in FIG. 5, may applied to multiple states, up to 256 per stage for K=9, by employing the trellis depicted in FIG. 5 as a sub-trellis over multiple states. Basic cascade structure operation may be referenced further in "Algorithms and Architectures for high speed Viterbi decoding", Ph.D. Dissertation, Dept. of Electrical Engineering, Stanford University, 1993, by Peter Black which is hereby incorporated by reference in its entirety.

The radix-16 ACS operates on a 16 state trellis and computes new state metrics for a forward step of four stages in the trellis. The cascade implementation achieves this by computing the state metrics for each intermediate stage (two states per radix-2 ACS unit within ACS blocks 150b through 156b) and passing the accumulated state metrics, with appropriate reordering (routing the outputs of the present stage to the correct inputs of the next stage) to the next cascade stage. The registers 160a–160f and cross switches 162–166 between the ACS blocks 150b through 156b, perform reordering as defined by the particular trellis stage. The cross switches either pass the data straight through or exchange the data on the two busses (shown as Bus A and Bus B) depending on which portion of the trellis is being operated upon. The cross switch settings may change at set rates during decoder 110 operation.

For operation on convolutional codes with 256 states, the trellis can be considered to be composed of an interleaving of 16 subtrellises of size 16. Thus, these subtrellises are fed to the cascade ACS datapath 122 in a sequential fashion, one after another. The correct nodes for each subtrellis are read from the SM memory 126, fed to the ACS datapath 122, then the results stored back into the SM memory 126. For all constraint length cases (K=9 through 5), 'in-place scheduling' is employed, thus only one copy of the state metrics are stored. In place scheduling refers to previous state metrics being overwritten by new state metric results after the ACS computations have completed.

The manner in which the 'in-place scheduled' trellis is partitioned into subtrellises has two phases, a phase A and a phase B, which repeat when moving forward through the trellis. For example, the 16 state trellis of FIG. 5 may be partitioned into subtrellises of size 4 over two stages. Phase A covers stage 1 and stage 2 wherein the subtrellises are interwoven. Phase B covers stage 3 and stage 4 wherein the subtrellises are separated and appear each one above another. This results in two distinct phases for generating memory addresses and state indices.

As compared to more traditional approaches which may operate on only one stage of the trellis at a time, the radix-16 cascade approach of the present invention is more energy efficient. Traditional approaches require reading and writing all state metrics once per stage while the present invention reduces this to once per four stages. Thus, power savings follow since memory I/O transactions consume large amounts of power.

In order to provide more efficient traceback operations (discussed below), a novel method for achieving a partial pretraceback of length four is achieved during the cascade ACS operation. Pretraceback implies that a partial traceback has been performed for each trellis stage prior to storing the path decision information for later traceback completion. In accordance with the present invention, the system employed to implement pretraceback is a combination of a unique register exchange (170a, 170b in FIG. 8) with extensions of the reordering hardware 160a through 160f and 162, 163, and 164 which is located between the ACS blocks 150b though 156b.

A pretraceback system is depicted in FIG. 8 in accordance with the present invention. The registers 166, which are part of the ACS data path, in the reordering structures are made wider depicted as (n) such that they can hold accumulating pretraceback paths. Registers 166 also provide a 10 bit accumulated state metric value from the previous stage. It is noted that before stage 150b in FIG. 7, n is equal to 0 bits since no trellis stages have been solved (ACS path determination) at this point. In stage 152b, n is equal to 1 bit since one stage has now been determined (path chosen), in stage 154b, n=2 bits, and in stage 156b, n=3 bits. After each ACS block 168a and 168b (top half of the ACS block 168a determines path for top butterfly node, and the bottom half ACS block 168b determines path for bottom butterfly node), an additional bit is provided to the next stage as a result of the ACS operations.

The additional bit indicates which path was selected from the previous stage as a result of the ACS operation. Bits 172a and 172b are provided as additional bits from the ACS blocks 168a and 168b to select (via mux's 170a and 170b) the selected paths 174a through 174d which have been carried forward (forwarding) from previous stages, to be appended to the selection path from the present stage. The appending function of the additional bits from the present stage to the chosen pretraceback bits from the prior stages (output of mux's 170a and 170b) is shown at reference numbers 176a and 176b. The register paths to the next stage are then represented as n+1 to indicate the accumulation of partial pretraceback bits which are carried forward to the next succeeding stage.

The register exchange, described above for partial pretraceback, in combination with the cascaded ACS 122 provides a unique decoding architecture for reducing memory accesses and reducing power consumption. The register exchange in conjunction with the cascaded ACS of the present invention updates traceback memory (described below) after determining paths over four stages of the trellis. This reduces traceback memory accesses by a factor of four.

This substantially reduces power consumption and substantially increases decoder 110 performance.

The cascade ACS structure 122 is also employed for determining codes of constraint lengths less than 9 (fewer than 256 states). There are two embodiments for implementing this feature which provides flexibility for operating with various constraint length convolutional encoders.

The preferred embodiment remains in harmony with the geometry of the trellis as in the manner of an in-place schedule (continually overwriting past state metric determinations with state metric determinations from the present stage). The geometry of the trellis, as shown in FIG. 5, repeats after a distance equal to the memory length (K−1). The constraint length codes are divided into two phases, which may not be symmetric, but such that the sum of the length of the two phases (number of stages) is always equal to the memory length. In particular, for K=8, 128 states, a phase I computation of radix-16 is determined over 4 stages of the trellis and a phase II computation of radix-8 is determined over 3 stages of the trellis. Similarly, for K=7, phase I is computed over four stages of radix-16, and phase II is determined over 2 stages of radix-4. For K=6, phase I is computed over four stages of radix-16 and phase II is computed over one stage of radix-2. For K=5, phase I is computed over four stages of radix-16 and phase II is unnecessary.

To operate the cascade ACS structure for a radix-8, 3 stage situation, for example, the first ACS stage 150b is bypassed and the metrics flow through the data path circuits 160a, 160b and 162, and are effectively fed into the $2^{nd}$ ACS block 152b. Analogously, for radix-4, 2 stage operations, data is effectively fed into the $3^{rd}$ ACS block 154b. For radix-2 operation, data is effectively fed into the last ACS block 156b. The bypass mechanism may be employed within the ACS block and may be any well known switching system (e.g., mux selected for bypass) for digitally routing accumulated state metric data through (around) the ACS block and reordering hardware without undergoing any computational changes. In an alternative embodiment, the ACS blocks and data path may be completely bypassed prior to the first ACS block required for computation. The radix-8 case, for example, would require bypassing circuits 150b, 160a, 160b and 162 which are shown in FIG. 7.

An advantage of the preferred embodiment is that generating state indices or memory addresses is relatively straight forward. It is to be appreciated that the ordering needed for each constraint length case may be expressed as an instance of a more general ordering algorithm. For example, unique address generators may be designed for this embodiment. An alternative embodiment operates by always performing radix-16 operations over 4 stages of the trellis, provided K>4. However, address generation becomes more involved.

Each ACS block 150b through 156b in the cascade datapath operates on a single trellis stage until all states have been processed. This implies that the set of branch metrics 134 for a given stage are provided to the State Metric Update Unit 120 for use in the associated ACS block. However, each butterfly operation in an ACS block requires a particular branch metric from the current data set and the particular branch metric is to be determined and selected. The branch metric selection depends upon the trellis state index and a user supplied code polynomial.

The preferred embodiment of the present invention provides two equivalent hardware blocks of equal size and virtually identical structure for providing the appropriate branch metrics to the ACS blocks 150b–156b. One BM selection unit 138 serves the first two ACS blocks 150b and 152b, and the other BM selection unit 138 serves the last two ACS blocks 154b and 156b.

Figure 9:
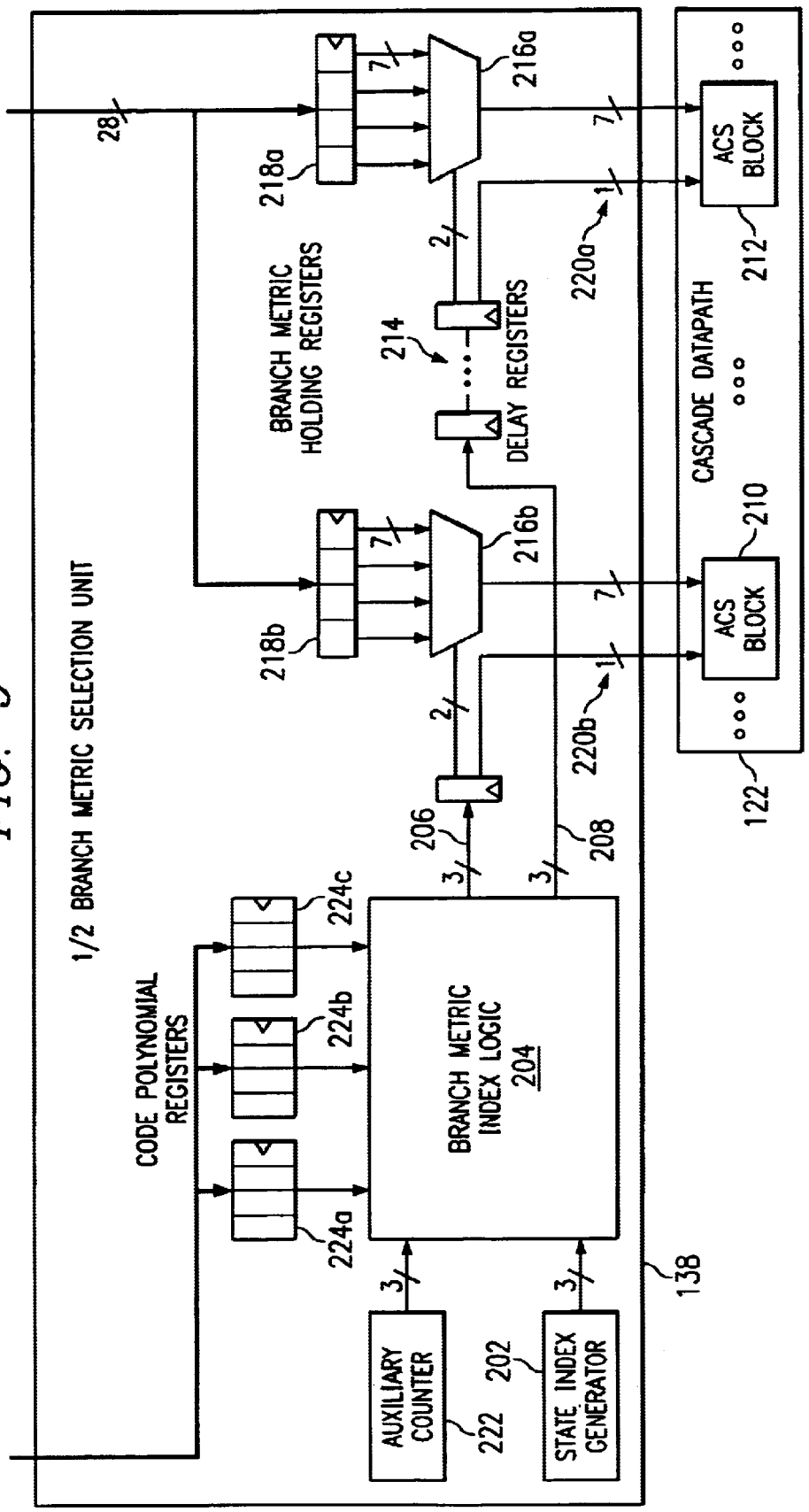
FIG. 9 is a schematic block diagram of branch metric selection unit for a Viterbi decoder in accordance with the present invention.

FIG. 9 depicts the general structure of one such branch metric selection unit 138. Each BM selection unit 138 consists of a state index generator 202 which provides state indices for the trellis and a branch metric index block 204. It is to be appreciated that the state index generator 202 may be considered as part of the address and control block 136 described earlier in FIG. 6. The branch metric index block 204 produces a first set of BM indices 206 and a second set of BM indices 208, one for each ACS block 210 and 212. The second set of indices 208, is fed through a chain of delay registers 214 which causes the indices to arrive at a BM selection multiplexor 216a at the correct time (synchronized to the ACS computation). The delays 214 follow the delay through the ACS cascade 210 and 212 and associated reordering hardware described above.

The BM selection mux's 216a and 216b utilize the indices from the branch metric index logic 204, and select the correct BM from a branch metric holding register 218a and 218b, from the set of branch metrics for the ACS stage. One bit 220a and 220b of the indices is also fed to the ACS blocks 210 and 212 and denotes the sign of the particular branch metric. As a result, only half of the branch metrics are stored and transported. It is to be appreciated that other convolutional coding schemes may be employed that may require more branch metrics to be stored and are thus contemplated by the present invention.

The state index generators (one generator not shown from the other ½ branch metric selection unit) create identical sequences representing the sequence of state indices for the trellis states fed into the ASC cascade datapath. The second state index generator (not shown) provides a delayed start relative to the first state index generator 202 to insure proper time alignment with the cascade states 3 and 4. The BM index block 204 employs each state index together with the code polynomials (in a manner similar to how the convolutional encoder generates output bits) to generate each branch metric index.

It is to be appreciated that the state sequence order is different in each ACS cascade stage and thus additional operations must be done in cascade stages 2, 3 and 4. In effect, the correct state index for each ACS stage is derived from the incoming index. The incoming index is generated as the first cascade stage sequence, but is directly related to the required index due to the reordering of the cascade structure which follows the geometry of the trellis. Thus, the required next stage indices may be derived by shifts of the incoming indices with the proper appending of 0's and 1's to fill the new empty slots (state metric column addresses). The proper set of 0's and 1's is defined by known trellis connections between the states and the state index position in the trellis. A counting mechanism 222 may be employed to provide appended bits and determine when to utilize different sets of indices for any particular cascade stage. For cascade stage 2, for example, one bit is appended, for stage 3, two bits are appended, and for stage 4, three bits are appended.

To further illustrate state index generation of the present invention, and referring back to the trellis of FIG. 5, state indices for stage 2 from those of stage 1 are described in more detail. Related to the properties of the trellis's butterfly structure, only one state index per butterfly is required. Also, note that when an index or node is referred to with regard to a particular stage, the index or node is referring to the left side of the stage.

The lower butterfly indices of column C1 are initially generated for stage 1 which produces the sequence of 8 indices: 8, 9, 10, 11, 12, 13, 14, and 15. To produce the state indices for stage 2, in the correct order of butterflies (i.e., top to bottom), observe the first four butterflies in stage 2 which begin atop column C2. Note that the top node of each of these indices in column C2 connects to a lower node in stage 1 which are those of the first four butterflies in stage 1. Specifically, the butterflies with indices 8, 9, 10 and 11. These indices are directly manipulated to produce the first four indices for stage 2 as follows: Interpret the indices as 4 bit numbers; each index is then shifted leftwards; the most significant bits are dropped; and the least significant bit becomes '0'. This mimics the action of the convolutional encoder when at any of these nodes and given a '0' for an input bit. The resulting four indices are 0, 2, 4 and 6 in column C2. Thus, indices for the first four butterflies of stage 2 are produced for the top nodes.

Now turning to the last four butterflies of stage 2 in FIG. 5, the bottom nodes connect to the bottom nodes of the last four butterflies of stage 1. Thus, the indices 12,13,14 and 15 from stage 1 are left shifted, the most significant bit dropped, and the least significant bit is set to '1'. This produces the indices, 9, 11, 13 and 15 of column C2 by again mimicking the convolutional encoder and assuming an input bit equal to '1'. The same process may be repeated for stage 3 and stage 4. It can be shown that the appended bits (least significant bits above) follow a set pattern. Specifically, a counting pattern from top to bottom. In the example above, the pattern is a '0' then '1', each for four consecutive butterflies. For the next stage, the pattern becomes: "00", "01", "10", and "11", each for two consecutive butterflies.

Generating a branch metric state index is analogous to generating a set of output bits for a given state in the convolutional encoder 44 shown in FIG. 3, for example. For branch metric indices however, some choice for a hypothetical input bit is required in addition to either the upper or lower state index of the butterfly. The input bit may simply be set to '0' when the state index is for the top butterfly node and to '1' for the opposite case. In addition, from the above discussion, it can be seen that the input bit is identical to the least significant bit of the state indices that were created from previous stage's indices since a '0' is appended to get to a next stage's top node and a '1' to get to a next stage's bottom node.

Figure 4:
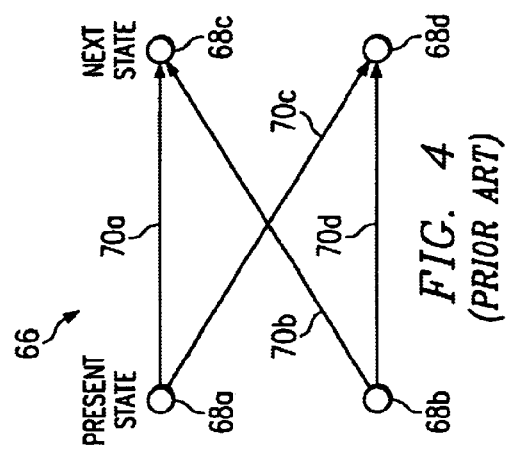
FIG. 4 is a prior art Viterbi algorithm butterfly structure illustrating possible encoder transitions from present state nodes to next state nodes.

Referring back to FIG. 4, if node 68*a* is the index with a most significant bit of '0' and node 68*c* is the index with a least significant bit of '0', then the branches 70*a* and 70*b* can only be traversed with an input bit of '0' and branches 70*c* and 70*d* traversed with an input bit of '1'. Further, it is well known that the output bits from branch 70*a* will be identical to those of branch 70*d*. It is this property that is utilized above to allow either the butterfly's top index 68*a* or bottom index 68*b* to be utilized for generating a branch metric index, provided the hypothetical input bit is set to select the horizontal branches in each case.

Referring again to FIG. 9, there are various embodiments in which the state sequence order operation described above may be implemented. In a preferred embodiment, arbitrary code polynomials are provided in which case a code polynomial register 224*a*–224*c* may hold the polynomial. Bit by bit, each polynomial may be logically ANDed with the derived state index from above and the resulting bits EXCLUSIVE-ORed together to form one bit of branch metric index (similar to convolutional encoding). Alternatively, if only a certain number of different codes are to be implemented, hardware may be provided specifically for the codes. This may be accomplished by writing out the logic equations for each code polynomial for the branch metric indices (bit by bit), in terms of the state index, counting index, and fixed code polynomial. Logic synthesis may then be employed to produce a compact representation. In either case, the same hardware may handle codes of different constraint lengths by logically cutting off (e.g., shifting, rotating) un-needed, higher order address bits. It is to be appreciated that the number of code polynomials may vary depending on the code rate. The embodiment depicted in FIG. 9 operates on the code rates of ½ and ⅓. It is further to be appreciated that the invention as disclosed herein may be applied to a plurality of other code rates (e.g., ¼, ⅕, etc.).

In addition, a single state index generator 202 may be employed to feed a branch metric index block that computes all four branch metric indices, each index may then be sent to the respective branch metric selection mux through the necessary delay chain. Also, a generator for each ACS block may be employed with the proper delay start time, thereby eliminating the delay registers.

Referring back to FIG. 6, the Traceback Unit 130 will now be described in greater detail. The main function of the Traceback Unit 130 is to perform traceback operations on the partial pretraceback decisions which have been stored in the traceback memory 132 during the ACS operations described above. The Traceback Unit 130 also performs the functions of accumulating and storing the decoded output data, and serves as buffer storage for the branch metrics on their route from the DSP 140 to the State Metric Update Unit 120.

The traceback operation consists of traversing backwards through the path decision data following a path that each new data item helps to construct. Once enough steps of the traceback process have been accomplished (convergence distance), decoded output bits may be accumulated, which are derived from the same data. The basic traceback operation is well known. The core of the Traceback Unit 130 is constructed as a direct implementation of the Viterbi algorithm as directed by the manner in which path decisions are stored in memory 132. The traceback operation of the present invention is unique in that it operates on various constraint length codes and with various lengths of pretraceback. Additionally, the Traceback Unit 130 simultaneously provides decision storage, traceback, decoded output storage and branch metric storage. The various storage requirements may be provided by one or more memory circuits.

For traceback operation with a pretraceback of length four, for example, the most common situation, a 32 bit word, which is described in more detail below, is read from the traceback memory 132 and the lower bits (least significant) of the state index shift register (not shown) are employed to select four bits from the 32 bit word. The four bits are the next pretraceback item that is needed and immediately becomes part of the next state index because these items have already been traced backwards. A portion of the MSBs of the state index are utilized together with a circular count variable to form the memory address.

When performing traceback with pretraceback lengths less than four, or codes of smaller constraint length, the hardware is constructed to select only the length needed from the memory word. The number and position of bits from the state index register are also adjusted accordingly. In this manner multiple codes are enabled.

Once the convergence length (survivor path distance) has been passed in the traceback process, the decoded output bits may be accumulated. The decoded output bits come directly from the selected portion of the memory word that is provided to the state index. These bits come in groups of identical size to the pretraceback length, and are accumulated into a 32 bit register and stored in the traceback memory 132 as needed.

The pretraceback decision bits arriving from the SM Update Unit 120 are also accumulated into a 32 bit register before being written into the traceback memory 132. The information is arranged sequentially within the register and in the memory 132 such that portions of the constructed state index may be utilized as pointers to the information as discussed above.

The Traceback Unit 130 controls all the I/O operations and buffer management concerning the traceback memory 132. Decoded output storage, branch metric storage and decision data storage all require circular buffers.

Figure 10:
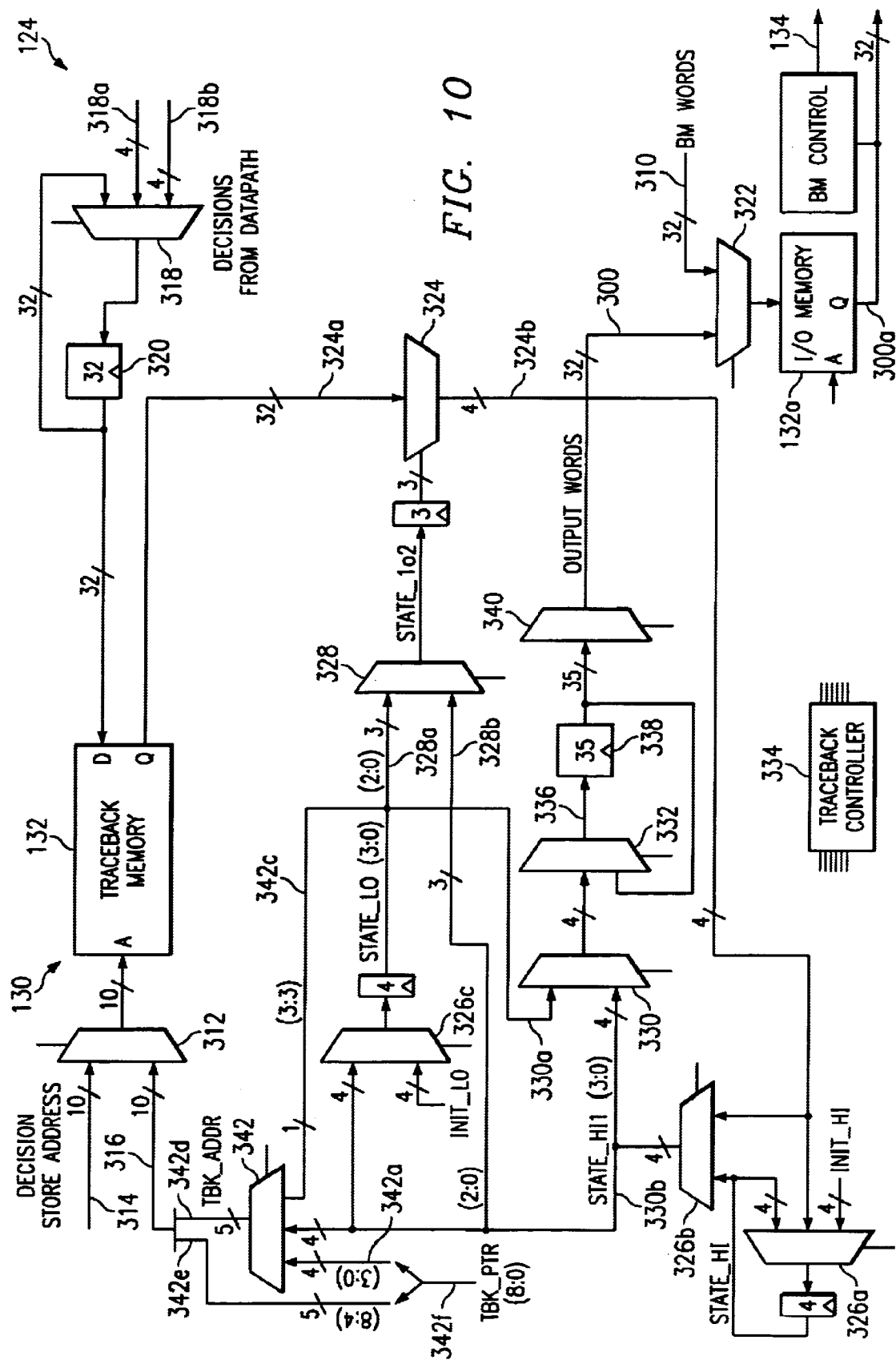
FIG. 10 is a schematic block diagram of a Traceback Unit in accordance with the present invention.

Now referring to FIG. 10, a more detailed schematic block diagram of the Traceback unit 130 is shown. In particular, FIG. 10 depicts how the Traceback Unit stores decision data 124 (i.e., partial pretraceback data) which is received from the cascaded ACS 122 illustrated in FIG. 6. An I/O memory 132a is included for storing decoded output words 300 and providing output words 300a to an external DSP 140, shown in FIG. 6. The I/O memory 132a also stores incoming Branch Metric words 310 from the DSP 140, and provides the appropriate branch metrics words 134 to the State Metric Unit 120. The Traceback Unit 130 also performs and fully controls all of the traceback operations and provides address generation and FIFO management as will be described in more detail below.

A plurality of multiplexors are shown in FIG. 10 for Traceback Unit 130 operations. Some of these are standard multiplexors in that they only choose as an output one of the input bit vectors that are shown. However, other multiplexors are generalized multiplexors. These have complex descriptions and will choose the output, from the inputs, by following a custom choice of inputs, which depends upon the control bits to the multiplexors. That is, the multiplexors may consider all the input vectors as individual bits grouped together and can choose any of these bits in any order as the selected output bits. These are built by providing particular definitions for bit choices which depend upon control bits within a VHDL process. This is then synthesized, usually into a layered structure, of traditional multiplexors.

A Traceback Memory Mux 312 is a standard multiplexor and chooses either the decision store address 314 or the Traceback address 316 to present to the traceback memory 132. A Decision Mux 318 is a generalized multiplexor and chooses decision input vectors and some feedback bits such that 8 bits of decisions 318a and 318b are placed into non-overlapping positions within a 32 bit register 320. The effect is that the vectors are stacked in order of arrival in the register 320 and stored in the memory 132 after 32 bits or 4 vector sets have arrived. An I/O Memory Data Mux 322 is standard multiplexor and selects output words 300 or branch metric words 310 for storage in the I/O memory 132a.

A Traceback Mux 324 is a standard Mux and considers a 32 bit input vector 324a as 8 vectors of 4 bits each, all in linear order. The mux 324 chooses one of the 4 bit vectors (318a or 318b that were previously stored in a word) as output 324b. Each of the 4 bits 324b are a partial pretraceback path segment (i.e., one of the 4 bit decisions that was stored previously, though at times only one, two, or three bits may be invalid because of bypassing as discussed above). The four bit partial pretraceback decisions 324b are then routed through standard mux's 326a, 326b and 326c.

A generalized mux 328 selects the correct 3 bits out of the 6 input bits 328a and 328b to use in the next cycle for choosing a correct portion of the traceback word. These 6 input bits 328a and 328b represent a portion of a present state index in the traceback process. The mux 328 selection depends upon the convolutional code's constraint length and how many stages of the trellis are being operated upon.

A generalized mux 330 selects out of the 8 bits of the present state index 330a or 330b, and selects a set of 4 bits that will be decoded output bits. However, at times, there may only be 3, 2, or 1 bits that are valid depending on the constraint length.

A generalized mux 332 effectively stacks valid decoded output bits 336 into an accumulation register 338. When 32 valid bits are stored in the accumulation register 338, they will be sent to the I/O memory 132a via generalized mux 340. Mux 340 selects the correct 32 bits which are valid decoded output bits out of 35 bits in the accumulation register 338. The selection depends upon constraint length and number of trellis stages.

A generalized Traceback Address Mux 342 forms the lower portion of the traceback address 342d for the next traceback word 324a. The mux 342 selects the correct address bits from 9 bits of input from 3 different vectors 342a, 342b and 342c. Again, the selection depends upon the constraint length and number of stages. The complete traceback address is constructed by concatenating the lower address bits 342d with the higher bits 342e of a traceback pointer 342f which is shown as an arrow feeding lines 342a and 342e. This pointer 324f comes from a counter (not shown) within the traceback controller 334 and provides for moving backwards through the traceback memory 132 to achieve traceback. A portion of the traceback pointer bits 342a may also be used to form the lower address bits 342d via mux 342 as necessary for various constraint length codes.

The traceback controller 334 contains all the logic for controlling the Traceback Unit 130, includes numerous counters, registers and multiplexors which are necessary for controlling the operations described previously, and for controlling address generation and memory data management.

Figure 11:
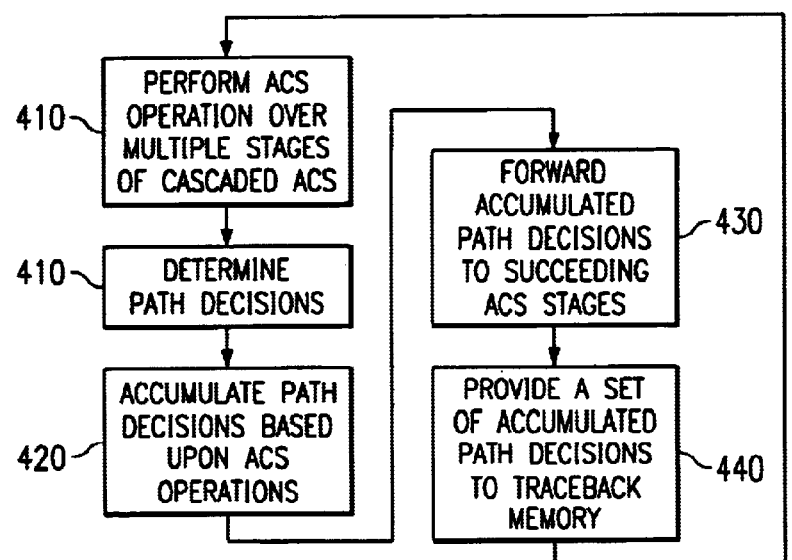
FIG. 11 is a flow chart diagram illustrating a methodology for Viterbi decoding in accordance with the present invention.

Now referring to FIG. 11, a methodology for a Viterbi decoding system is shown in accordance with the present invention. At step 400, a plurality of ACS operations are performed over a plurality of ACS stages via a cascaded ACS unit 122 as described above (see, e.g., FIG. 7). Proceeding to step 410, path decisions are determined for all branches entering a stage of the ACS 122 as a result of the ACS operations of step 400 (see, e.g., FIG. 7, FIG. 8). Proceeding to step 420, path decisions are accumulated during the ACS operations by widening the data path of the ACS (e.g., appending path decision bits to the ACS data path, see, e.g., FIG. 8).

At step 430, accumulated path decisions are forwarded to succeeding ACS stages (see, e.g., FIG. 8). This may be accomplished, for example, by routing the accumulated path decisions to the succeeding ACS stages based upon identified path decisions of the succeeding ACS stage (e.g., path decision bit of succeeding stage selects accumulated path from previous stage via mux circuit). The accumulated path decisions are then combined with the path decisions of the succeeding ACS stage via the mux circuit (see, e.g., FIG. 8).

At step 440, a set of accumulated path decisions over a plurality of ACS stages are provided to the traceback memory. For example, the accumulated path decisions may be appended to the path decisions of succeeding ACS stages. The appended path decisions are then stored in the widened ACS data path (see, e.g., FIG. 8). After completing step 440, the process proceeds back to step 400 whereby more decoding operations may be performed.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A decoder system, comprising:
   a State Metric Update unit including
     a state metric memory;
     a cascaded Add/Compare/Select (ACS) unit, comprising:
       a plurality of serially coupled ACS stages arranged in a sequence, a first ACS stage having an input coupled to the state metric memory and a last ACS stage having an output coupled to the state metric memory, each ACS stage for computing an accumulated state metric from a prior state metric and a branch metric, and for identifying a path decision, each ACS stage forwarding the accumulated state metric and an appended indicator of the path decision along the sequence, so that the path decisions are accumulated along the sequence of ACS stages; and
       routing circuitry disposed between ACS stages in the sequence, for routing the accumulated state metric and appended indicators from one ACS stage to a next ACS stage in the sequence;
   a Traceback unit, comprising:
     a traceback memory for storing the accumulated path decisions from the last ACS stage in the sequence; and
   traceback logic circuitry for generating decoded output bits from the accumulated path decisions.

2. A decoder system, comprising:
   a State Metric Update unit including a state metric memory and a cascaded Add/Compare/Select (ACS) unit,
   wherein the cascaded ACS unit comprises a plurality of serially coupled ACS stages for performing a plurality of ACS operations in connection with the state metric memory,
   wherein an ACS stage is operable to identify a plurality of path decisions and communicate the identified path decisions to a next ACS stage coupled thereto, the identified path decisions accumulated as a set by widening an ACS data path to receive the identified path decisions from the ACS stage and forwarding the identified path decisions to a path selection circuit within the next ACS stage during ACS operations, and
   a Traceback unit for storing a set of accumulated path decisions in a traceback memory associated therewith, and performing a traceback on the set of accumulated path decisions,
   wherein the path decisions associated with the AC stage and the next ACS stage are accumulated as a set during the ACS operations before being written to the traceback memory, thereby minimizing accesses to the traceback memory.

3. The decoder system of claim 2, wherein the path selection circuit is operable to accumulate the identified path decisions by combining the identified path decisions from the ACS stage with identified path decisions from the next ACS stage.

4. The decoder system of claim 3, wherein the combined identified path decisions are maintained in the widened ACS data path.

5. The decoder circuit of claim 3, wherein the path selection circuit further comprises at least one multiplexor for selecting and routing identified path decisions to the next ACS stage, and at least one appending circuit for combining path decisions from the ACS stage with the identified path decisions from the next ACS stage.

6. The decoder system of claim 5, wherein one or more of the ACS stages are selectively bypassed to facilitate flexible operations on a plurality of constraint length convolutional codes.

7. The decoder system of claim 5 wherein the one or more ACS stages are selectively bypassed via a switching system.

8. The decoder system of claim 5, wherein one or more of the ACS stages and a set of data path registers and a set of cross switches are selectively bypassed to facilitate flexible operations on a plurality of constraint length convolutional codes.

9. The decoder system of claim 8, wherein the one or more ACS stages and the set of data path registers and the set of cross switches are selectively bypassed via a switching system.

10. The decoder system of claim 1, further comprising a branch metric selection unit operable to select and synchronize a set of branch metric values with a set of state metric values during ACS operations.

11. A decoder system, comprising:
    a State Metric Update unit including a state metric memory, a cascaded Add/Compare/Select (ACS) unit, and a branch metric selection unit operable to select and synchronize a set of branch metric values with a set of state metric values during ACS operations, the branch metric selection unit including a delay circuit for synchronizing the set of branch metrics with respect to a plurality of ACS stages,
    wherein the cascaded ACS unit comprises a plurality of serially coupled ACS stages for performing a plurality of ACS operations in conjunction with the state metric memory,
    wherein an ACS stage is operable to identify a plurality of path decisions and communicate the identified path decisions to a next ACS stage coupled thereto, and
    a Traceback unit for storing a set of accumulated path decisions in a traceback memory associated therewith, and performing a traceback on the set of accumulated path decisions,
    wherein the path decisions associated with the ACS stage and the next ACS stage are accumulated as a set during the ACS operations before being written to the traceback memory, thereby minimizing accesses to the traceback memory.

12. A decoder system comprising:
a State Metric Update unit including a state metric memory, a cascaded Add/Compare/Select (ACS) unit, and a branch metric selection unit operable to select and synchronize a set of branch metric values with a set of state metric values during ACS operations, the branch metric selection unit including a state index generator for providing state metric memory addressing for identifying state metric values for stages of the cascaded ACS unit and state indices for branch metric selection,
wherein the cascaded ACS unit comprises a plurality of serially coupled ACS stages for performing a plurality of ACS operations in conjunction with the state metric memory,
wherein an ACS stage is operable to identify a plurality of path decisions and communicate the identified path decisions to a next ACS stage coupled thereto, and
a Traceback unit for storing a set of accumulated path decisions in a traceback memory associated therewith, and performing a traceback on the set of accumulated path decisions,
wherein the path decisions associated with the ACS stage and the next ACS stage are accumulated as a set during the ACS operations before being written to the traceback memory, thereby minimizing accesses to the traceback memory.

13. The decoder system of claim 10, wherein the branch metric selection unit comprises including a set of code polynomial registers for storing user supplied code polynomials and enabling flexible operations on a plurality of convolutional codes.

14. A decoder system, comprising:
a State Metric Update unit including a state metric memory, a cascaded Add/Compare/Select (ACS) unit, and a branch metric selection unit operable to select and synchronize a set of branch metric values with a set of state metric values during ACS operations, the branch metric selection unit comprising:
a set of code polynomial registers for storing user supplied code polynomials and enabling flexible operations on a plurality of convolutional codes;
a branch metric index logic circuit for receiving the user supplied code polynomials, wherein the branch metric index logic receives a state index and an auxiliary counter to produce branch metric indices for multiple ACS stages and to select a correct branch metric;
wherein the cascaded ACS unit comprises a plurality of serially coupled ACS stages for performing a plurality of ACS operations in conjunction with the state metric memory,
wherein an ACS stage is operable to identify a plurality of path decisions and communicate the identified path decisions to a next ACS stage coupled thereto, and
a Traceback unit for storing a set of accumulated path decisions in a traceback memory associated therewith, and performing a traceback on the set of accumulated path decisions,
wherein the path decisions associated with the ACS stage and the next ACS stage are accumulated as a set during the ACS operations before being written to the traceback memory, thereby minimizing accesses to the traceback memory.

15. The decoding system of claim 1, further including a DSP interface circuit operatively coupled to both the State Metric Update unit and the Traceback unit, wherein the DSP interface circuit communicates the branch metrics from a DSP to the Traceback unit and transmits decoded output bits from the Traceback unit to the DSP.

16. The decoding system of claim 15 wherein the DSP performs branch metric computations and depuncturing thereby facilitating flexible operations of the decoding system.

17. The traceback unit of claim 1 wherein traceback operations are performed on a plurality of constraint length codes.

18. A decoder system, comprising:
a State Metric Update unit including a state metric memory and a cascaded Add/Compare/Select (ACS) unit,
wherein the cascaded ACS unit comprises a plurality of serially coupled ACS stages for performing a plurality of ACS operations in conjunction with the state metric memory,
wherein an ACS stage is operable to identify a plurality of path decisions and communicate the identified path decisions to a next ACS stage coupled thereto, and
a Traceback unit for storing a set of accumulated path decisions in a traceback memory associated therewith, and performing a traceback on the set of accumulated path decisions having a plurality of traceback widths,
wherein the path decisions associated with the ACS stage and the next ACS stage are accumulated as a set during the ACS operations before being written to the traceback memory, thereby minimizing accesses to the traceback memory.

19. The decoder system traceback of claim 18 wherein the traceback widths are represented by accumulated path decision bits that are variable in size.

20. A decoder system, comprising:
a State Metric Update unit including a state metric memory and a cascaded Add/Compare/Select (ACS) unit,
wherein the cascaded ACS unit comprises a plurality of serially coupled ACS stages for performing a plurality of ACS operations in conjunction with the state metric memory, and is adapted to operate on a plurality of trellis sizes via a subtrellis configuration in conjunction with the state metric memory,
wherein an ACS stage is operable to identify a plurality of path decisions and communicate the identified path decisions to a next ACS stage coupled thereto, and
a Traceback unit for storing a set of accumulated path decisions in a traceback memory associated therewith, and performing a traceback on the set of accumulated path decisions,
wherein the path decisions associated with the ACS stage and the next ACS stage are accumulated as a set during the ACS operations before being written to the traceback memory, thereby minimizing accesses to the traceback memory.

21. A method for Viterbi decoding comprising the steps of:

performing Add/Compare/Select (ACS) operations over a plurality of ACS stages arranged in a sequence;

determining path decisions during the ACS operations;

accumulating the path decisions based upon the ACS operations by appending each determined path decision to path decisions from previous ACS stages in the sequence and to an accumulated state metric;

forwarding the accumulated path decisions and the accumulated state metric to a succeeding ACS stage of the plurality of AC stages; and providing the accumulated path decisions as a set to a traceback memory to reduce traceback memory accesses.

22. The method of claim 21, wherein the step of forwarding the accumulated path decisions further comprises the steps of:

routing the accumulated path decisions of a succeeding ACS stage based upon identified path decisions of a present ACS stage.

* * * * *